US012586752B2

(12) United States Patent
Saitoh et al.

(10) Patent No.: US 12,586,752 B2
(45) Date of Patent: Mar. 24, 2026

(54) ELECTRON MICROSCOPE AND SPECIMEN ORIENTATION ALIGNMENT METHOD

(71) Applicant: JEOL Ltd., Tokyo (JP)

(72) Inventors: Motofumi Saitoh, Tokyo (JP); Shuji Kawai, Tokyo (JP)

(73) Assignee: JEOL Ltd., Tokyo (JP)

( * ) Notice: Subject to any disclaimer, the term of this patent is extended or adjusted under 35 U.S.C. 154(b) by 449 days.

(21) Appl. No.: 18/243,178

(22) Filed: Sep. 7, 2023

(65) Prior Publication Data

US 2024/0087840 A1    Mar. 14, 2024

(30) Foreign Application Priority Data

Sep. 9, 2022    (JP) .................................. 2022-143719
Jul. 20, 2023    (JP) .................................. 2023-118351

(51) Int. Cl.
H01J 37/20        (2006.01)
H01J 37/22        (2006.01)

(52) U.S. Cl.
CPC ........... H01J 37/20 (2013.01); H01J 37/222 (2013.01); *H01J 2237/20207* (2013.01); *H01J 2237/20221* (2013.01); *H01J 2237/20285* (2013.01)

(58) Field of Classification Search
CPC .. G01N 23/04; G01N 23/203; G01N 23/2055; G01N 23/20058; G01N 23/20025; H01J 37/20; H01J 37/222; H01J 37/252; H01J 37/265; H01J 37/2955; H01J 37/3056; H01J 2237/20221; H01J 2237/20285; H01J 2237/20207; H01J 2237/24455; H01J 2237/24528; H01J 2237/24578; H01J 2237/20214; H01J 2237/31749
See application file for complete search history.

(56) References Cited

U.S. PATENT DOCUMENTS

2020/0349690 A1*  11/2020  Latourte ............ G01N 23/2251
2022/0216034 A1    7/2022  Dobashi et al.

FOREIGN PATENT DOCUMENTS

JP        201092625 A      4/2010
JP        2010212067 A      9/2010
WO        2020217297 A1    10/2020

OTHER PUBLICATIONS

Office Action issued in JP2023-118351 on Aug. 6, 2024.

* cited by examiner

*Primary Examiner* — David E Smith
*Assistant Examiner* — Hsien C Tsai
(74) *Attorney, Agent, or Firm* — The Webb Law Firm

(57)        ABSTRACT

An electron microscope includes an irradiation optical system that irradiates a specimen with an electron beam, a specimen stage that supports the specimen, an image forming optical system that forms an image of electrons transmitted through the specimen, an imaging apparatus that captures an image formed by the image forming optical system, and a control unit that controls inclination of the specimen with respect to an incident direction of the electron beam. The irradiation optical system includes an aperture that cuts off a part of the electron beam to be irradiated to the specimen. The control unit acquires an image including Kikuchi bands that appear in a shadow region of the aperture, detects the Kikuchi bands in the shadow region of the aperture in the image, and controls inclination of the specimen with respect to the incident direction of the electron beam, based on the detected Kikuchi bands.

8 Claims, 8 Drawing Sheets

ELECTRON MICROSCOPE AND SPECIMEN ORIENTATION ALIGNMENT METHOD

CROSS-REFERENCE TO RELATED APPLICATIONS

This application claims priority to Japanese Patent Application No. 2022-143719, filed Sep. 9, 2022, and Japanese Patent Application No. 2023-118351, filed Jul. 20, 2023, the disclosures of which are hereby incorporated by reference in their entireties.

BACKGROUND OF THE INVENTION

Field of the Invention

The present invention relates to an electron microscope and a specimen orientation alignment method.

Description of Related Art

When TEM observation is performed on a crystalline specimen, normally an incident direction of an electron beam is aligned a zone axis before performing the observation. In the case of observing an amorphous specimen on a single crystal substrate as well, observation is usually performed aligning the incident direction of the electron beam with the zone axis of the substrate, in order to ensure image capturing conditions.

As a method of adjusting the inclination angle of a specimen so that the incident direction of the electron beam matches with the zone axis of the specimen (hereafter "specimen orientation alignment method"), a method for using an electron diffraction pattern and a method for using a Kikuchi pattern are known.

For example, JP-A-2010-212067 discloses a specimen orientation alignment method using an electron diffraction pattern. Further, JP-A-2010-92625 discloses a specimen orientation alignment method using a Kikuchi pattern.

In the case of performing a specimen orientation alignment using a Kikuchi pattern, a specimen image and a diffraction spot may overlap with Kikuchi bands, and in this case, it is normally difficult to detect the Kikuchi bands mechanically.

SUMMARY OF THE INVENTION

According to a first aspect of the present disclosure, there is provided an electron microscope including:
  an irradiation optical system that irradiates a specimen with an electron beam;
  a specimen stage that supports the specimen;
  an image forming optical system that forms an image of electrons transmitted through the specimen;
  an imaging apparatus that captures an image formed by the image forming optical system; and
  a control unit that controls inclination of the specimen with respect to an incident direction of the electron beam,
  the irradiation optical system including an aperture that cuts off a part of the electron beam to be irradiated to the specimen,
  the control unit acquiring an image including Kikuchi bands that appear in a shadow region of the aperture,
  the control unit detecting the Kikuchi bands in the shadow region of the aperture in the image, and the control unit controlling inclination of the specimen with respect to the incident direction of the electron beam, based on the detected Kikuchi bands.

According to a second aspect of the present disclosure, there is provided a specimen orientation alignment method for an electron microscope including an irradiation optical system that irradiates a specimen with an electron beam, a specimen stage that supports the specimen, an image forming optical system that forms an image of electrons transmitted through the specimen, and an imaging apparatus that captures an image formed by the image forming optical system, the irradiation optical system including an aperture that cuts off a part of the electron beam to be irradiated to the specimen,
  the method including:
  acquiring an image including Kikuchi bands that appear in a shadow region of the aperture;
  detecting the Kikuchi bands in the shadow region of the aperture in the image; and
  controlling inclination of the specimen with respect to the incident direction of the electron beam, based on the detected Kikuchi bands.

DESCRIPTION OF THE INVENTION

According to an embodiment of the present disclosure, there is provided an electron microscope including:
  an irradiation optical system that irradiates a specimen with an electron beam;
  a specimen stage that supports the specimen;
  an image forming optical system that forms an image of electrons transmitted through the specimen;
  an imaging apparatus that captures an image formed by the image forming optical system; and
  a control unit that controls inclination of the specimen with respect to an incident direction of the electron beam,
  the irradiation optical system including an aperture that cuts off a part of the electron beam to be irradiated to the specimen,
  the control unit acquiring an image including Kikuchi bands that appear in a shadow region of the aperture, the control unit detecting the Kikuchi bands in the shadow region of the aperture in the image, and the control unit controlling inclination of the specimen with respect to the incident direction of the electron beam, based on the detected Kikuchi bands.

In this electron microscope, the control unit can acquire an image including Kikuchi bands which appears in a shadow region of an aperture, and can detect Kikuchi bands in the shadow region of the aperture in the image, hence the Kikuchi bands can be easily detected.

According to an embodiment of the present disclosure, there is provided a specimen orientation alignment method for an electron microscope including an irradiation optical system that irradiates a specimen with an electron beam, a specimen stage that supports the specimen, an image forming optical system that forms an image of electrons transmitted through the specimen, and an imaging apparatus that captures an image formed by the image forming optical system, the irradiation optical system including an aperture that cuts off a part of the electron beam to be irradiated to the specimen, the method including:

acquiring an image including Kikuchi bands that appear in a shadow region of the aperture;

detecting the Kikuchi bands in the shadow region of the aperture in the image; and controlling inclination of the specimen with respect to the incident direction of the electron beam, based on the detected Kikuchi bands.

In this specimen orientation alignment method, an image including Kikuchi bands, which appears in a shadow region of an aperture, is acquired, and Kikuchi bands are detected in the shadow region of the aperture in the image, hence the Kikuchi bands can be easily detected.

Now preferred embodiments of the present invention will be described in detail with reference to the drawings. The embodiments described below are not intended to unduly limit the contents of the present invention described in the claims. Further, all of the components described below are not necessarily essential requirements of the present invention.

1. Electron Microscope

Figure 1:
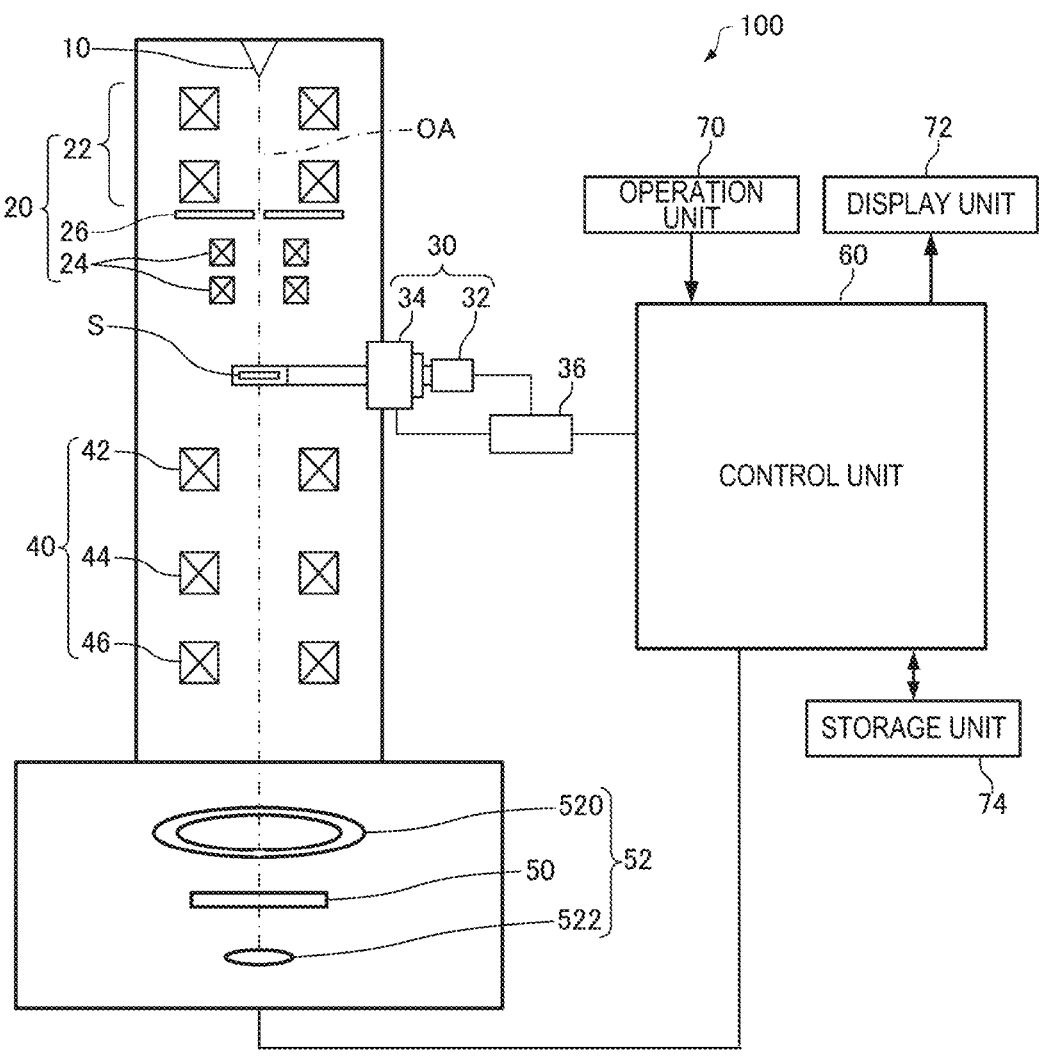
FIG. 1 is a diagram illustrating a configuration of an electron microscope according to an embodiment of the present invention.

An electron microscope according to an embodiment of the present invention will be described first with reference to the drawings. FIG. 1 is a diagram illustrating a configuration of the electron microscope 100 according to an embodiment of the present invention.

As illustrated in FIG. 1, the electron microscope 100 includes an electron source 10, an irradiation optical system 20, a specimen stage 30, an image forming optical system 40, an imaging apparatus 50, a detector 52 (annular detector 520 and detector 522), a control unit 60, an operation unit 70, a display unit 72 and a storage unit 74.

The electron microscope 100 can switch between a TEM mode and a STEM mode. In the TEM mode, a specimen image (TEM image) and an electron diffraction pattern are formed using electrons transmitted through or diffracted by a specimen S, and are captured by the imaging apparatus 50. In the STEM mode, the specimen S is scanned with a thinly focused electron beam, then the intensity of the electron beam transmitted or scattered at each scanning position is detected by the detector 52, whereby a scanning transmission electron microscope (STEM) image is acquired. The STEM image can be acquired by detecting electrons scattered by the specimen S using the annular detector 520 or by detecting electrons transmitted through the specimen S using the detector 522. In a case of acquiring a Ronchigram image, the Ronchigram image is captured by detecting the electrons transmitted through the specimen S using the imaging apparatus 50, without scanning the specimen S in the STEM mode.

The electron source 10 generates electron beams. The electron source 10 is an electron gun, for example, which emits an electron beam by accelerating electrons emitted from a cathode at an anode.

The irradiation optical system 20 irradiates the specimen S with the electron beam emitted from the electron source 10. The irradiation optical system 20 includes, for example, a plurality of electron lenses 22 (condenser lenses), a deflector 24, and an aperture 26. The plurality of electron lenses 22 focuses the electron beam emitted from the electron source 10 and irradiates the specimen S therewith. In the electron microscope 100, an electron probe is formed by the electron beam, which is thinly focused by the pre-magnetic field of the electron lens 22 and an objective lens 42. In other words, in the STEM mode, the irradiation optical system 20 includes a lens formed by the pre-magnetic field of the objective lens 42. The deflector 24 two-dimensionally deflects the electron beam that enters the specimen S.

In the electron microscope 100, the electron probe is formed by thinly focusing the electron beam by the pre-magnetic field of the electron lens 22 and the objective lens 42, and this electron probe is two-dimensionally deflected by the deflector 24. Thereby the specimen S can be scanned with the electron probe.

The aperture 26 (condenser aperture) cuts off a part of the electron beam to be irradiated to the specimen S. For example, the aperture 26 has a plurality of aperture holes of which hole diameters are mutually different. By selecting the aperture hole, the aperture angle and irradiation dose of the electron beam can be adjusted.

The specimen stage 30 holds the specimen S. The specimen stage 30 includes a specimen holder 32 and a goniometer 34. The specimen holder 32 supports the specimen S. The goniometer 34 has an inclining mechanism to incline the specimen S. The specimen stage 30 may have a rotating mechanism to rotate the specimen S around the optical axis OA.

The specimen stage 30 is controlled by the control unit 60 via a driving circuit 36. For example, when an instruction to incline the specimen S is received, the control unit 60 generates a control signal in accordance with this instruction, and sends the control signal to the driving circuit 36. The driving circuit 36 operates the inclining mechanism (goniometer 34) in accordance with the control signal. The other operations of the specimen stage 30 are also performed in the same manner.

The image forming optical system 40 forms an image of the electrons transmitted through the specimen S. The image forming optical system 40 includes an objective lens 42, an intermediate lens 44 and a projection lens 46. In the TEM mode, the image forming optical system 40 forms an electron diffraction pattern and a specimen image (TEM image) using electrons transmitted through the specimen S (transmitted electrons). For example, by focusing the intermediate lens 44 on the specimen image (TEM image) formed by the objective lens 42, the specimen image can be formed on the object plane of the projection lens 46. Thereby the imaging apparatus 50 can capture the specimen image. Further, by focusing on the electron diffraction pattern formed by the objective lens 42 by changing the focal distance of the intermediate lens 44, the electron diffraction pattern can be formed on the object plane of the projection lens 46. Thereby the imaging apparatus 50 can capture the electron diffraction pattern.

In the STEM mode, the image forming optical system 40 guides the electrons, which were scattered by the specimen S at predetermined angles, to the detector 52. The Ronchigram is captured by the imaging apparatus 50.

The imaging apparatus 50 captures the specimen image and the electron diffraction pattern formed by the image forming optical system 40. The imaging apparatus 50 is a digital camera, for example, such as a charge coupled device (CCD) camera. The image data of the TEM image and the electron diffraction pattern captured by the imaging apparatus 50 are sent to the control unit 60, and are stored in the storage unit 74.

The electron microscope 100 may also include a fluorescent screen to visualize the TEM image, electron diffraction pattern, and the like, and an imaging apparatus to capture an image visualized on the fluorescent screen. The Ronchigram can also be captured using the fluorescent screen.

The detector 52 detects electrons scattered by the specimen S. For example, the STEM image can be acquired by detecting the intensity of the electron beam using the detector 52, synchronizing by scanning with the electron probe.

The operation unit 70 is for the user to input operation information, and outputs the inputted operation information to the control unit 60. The functions of the operation unit 70 can be implemented by such hardware as a keyboard, a mouse, buttons, a touch panel, and a touch pad.

The display unit 72 displays an image generated by the control unit 60. A captured specimen image and electron diffraction pattern, for example, are displayed on the display unit 72. The functions of the display unit 72 can be implemented by an LCD, CRT, a touch panel that also functions as the operation unit 70, or the like.

The storage unit 74 stores programs and various data to cause the computer to function as the control unit 60. The storage unit 74 also functions as a work area of the control unit 60. The functions of the storage unit 74 can be implemented by a hard disk, a random access memory (RAM), and the like.

The control unit 60 controls each component of the electron microscope 100, such as the electron source 10, the irradiation optical system 20, the specimen stage 30, the image forming optical system 40, the imaging apparatus 50, and the detector 52. The control unit 60 controls inclination of the specimen S with respect to the electron beam that enters the specimen S. In other words, the control unit 60 performs orientation alignment of the specimen S. The orientation alignment of the specimen S will be described later.

The functions of the control unit 60 (computer) can be implemented by executing programs using such hardware as various processors (e.g. CPU, DSP).

2. Specimen Orientation Alignment Method 2.1. Specimen Orientation Alignment Method Using Kikuchi Pattern The specimen orientation alignment refers to adjusting the inclination of the specimen with respect to the incident direction of the electron beam, such that the incident direction of the electron beam matches with the zone axis of the specimen. In the electron microscope 100, the orientation alignment of the specimen S is performed using a Kikuchi pattern.

Figure 2:
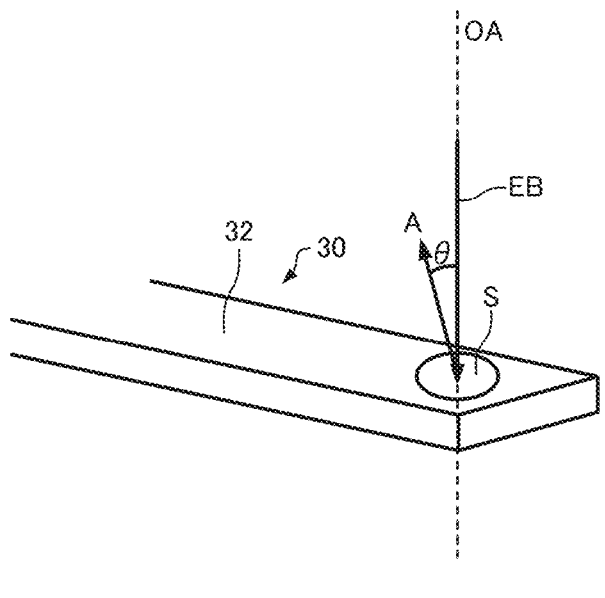
FIG. 2 is a perspective view schematically illustrating a specimen stage on which a specimen is held.

FIG. 2 is a perspective view schematically illustrating the specimen stage 30 that holds the specimen S.

In FIG. 2, the zone axis A of the specimen S deviates from the incident direction of the electron beam EB. By performing the orientation alignment of the specimen S, the incident direction of the electron beam EB can be matched with the zone axis A of the specimen S. In other words, the angle $\theta$ of the zone axis A, with respect to the incident direction (optical axis OA) of the electron beam EB, can be adjusted to $\theta=0°$.

Here the Kikuchi pattern is generated by the electrons that entered the specimen causing Bragg reflection (elastic scattering) after receiving inelastic scattering (thermal diffuse scattering) generated by thermal vibration of atoms inside the crystalline specimen. A Kikuchi pattern is a type of an electron diffraction pattern that is acquired in the observation with STEM or TEM, and is more easily generated as the specimen thickens. The Kikuchi pattern is constituted of Kikuchi bands corresponding to crystal planes. In the Kikuchi pattern, related bands (Kikuchi bands) appear in the direction where the crystal planes are facing, and the bands radially spread centering around a position where the zone axis is facing. In other words, the Kikuchi bands densely intersect at a position corresponding to the zone axis direction.

2.2. Procedure of Orientation Alignment (1) Image Capturing

The specimen S is mounted on the specimen holder 32, then the specimen holder 32 is inserted into the goniometer 34, and in this state, the specimen S is loaded into a specimen chamber inside a lens barrel of the electron microscope 100. Then the field-of-view is adjusted in the TEM mode, for example, so that the region to be observed is included in the field-of-view. In a case where the observation target is amorphous, the field-of-view is adjusted so that the region of which orientation is aligned, such as a single crystal substrate, is included in the field-of-view.

Next if the current mode is the TEM mode, the mode is switched to the STEM mode. Then the aperture 26 is inserted onto the optical axis OA. Here the camera length is adjusted so that the capturing angle determined by the aperture 26 becomes about 2 to 5 times of the incident angle. Thereby most of the field-of-view becomes a shadow of the aperture 26.

Here an appropriate size of the aperture will be described. In the present embodiment, the orientation deviation of the specimen is detected using a portion, which does not directly overlap with the transmitted light but extends into the shadow of the aperture, out of the Kikuchi pattern generated by inelastic scatting and diffraction in the specimen. Therefore it is preferable that the size of the shadow portion is larger.

There are two methods to make the shadow in the field-of-view large. One is to decrease a hole diameter of the aperture, and the other is to decrease the camera length. The aperture diameter in the field-of-view can be decreased by both methods, but in terms of using a Kikuchi pattern having high signal intensity, the method of decreasing the hole diameter of the aperture is preferable.

The Kikuchi pattern is generated by scattering and diffraction, hence the intensity of the pattern becomes weak in a region distant from the center of the field-of-view, where the scattering angle and the diffraction angle are large. If the camera length is decreased, the capturing angle increases, hence more Kikuchi patterns having weak intensity can be captured at locations distant from the center of the field-of-view. However, a Kikuchi pattern having strong intensity located near the center of the field-of-view enters the aperture diameter and cannot be used for analysis.

In the case of decreasing the aperture diameter, on the other hand, the Kikuchi pattern having strong intensity located near the center of the field-of-view extends out of the aperture diameter, hence the Kikuchi pattern having strong intensity can be used for analysis.

Therefore in terms of imaging a Kikuchi pattern having strong intensity, it is preferable that the aperture diameter is as small as possible.

However, decreasing the aperture diameter too much generates a negative effect. The Kikuchi pattern is generated by the emitted electrons, which inelastically scattered in various direction in the specimen, causing diffraction by the crystals. Therefore the direction in which diffraction is generated is determined only by the orientation of the crystals, and does not depend on the orientation of the emitted electron beam.

Therefore if the aperture diameter is increased, electrons having different incident angles are emitted, but the intensity of the Kikuchi pattern increases because the position of the generated Kikuchi pattern does not change. Whereas if the aperture diameter is decreased, the intensity of the Kikuchi pattern decreases.

On the other hand, a diffraction spot is simultaneously generated if the emitted electron is directly diffracted. The position of diffraction spot depends on both the incident direction of the electrons and the orientation of the crystals, hence if the aperture diameter is increased and electrons having different incident angles are emitted, the diffraction spots spread and create a diffraction disk. The integral value of the intensity of the diffraction spot or the diffraction disk increases as the aperture diameter increases, but the brightness does not increase. Whereas even if the aperture diameter is decreased, brightness does not decrease although the areas of the diffraction spot and diffraction disk decrease.

This means that if the aperture diameter is decreased too much, the Kikuchi pattern becomes dark, and the dark Kikuchi pattern is superimposed on the diffraction spot and diffraction disk, which makes analysis difficult.

In view of the above aspects, the aperture diameter must be within an appropriate range, and the incident angle is preferable about 20 mrad to 100 mrad.

Next the focus is shifted by changing the excitation of the objective lens 42. Normally when a STEM image is captured, the electron beam EB is very thinly focused on the specimen S to generate the electron probe. By shifting the focus, the electron beam EB is not converged on the specimen S but is irradiated to a wider range on the specimen S. Thereby damage to the specimen S caused by radiation of the electron beam EB can be reduced. An optimum amount of shifting the focus (defocus amount) is set considering the vulnerability of the specimen S to the electron beam EB, irradiation dose of the electron beam EB, exposure time, and the like.

In the above description, the focus is shifted by changing the excitation of the objective lens 42, but the focus may be shifted by changing the acceleration voltage, or the focus may be shifted by changing the position (height) of the specimen S in the vertical direction using the specimen stage 30.

Next the Kikuchi pattern is captured by the imaging apparatus 50. When the image is captured, the exposure time is set to about 1 second, for example. By performing exposure for a long time like this, the Kikuchi band appears in the shadow portion of the aperture 26 in the captured image.

The exposure time is set such that the average value of the brightness of the bright portion inside the aperture 26 becomes about 80% of the saturated value, for example. Thereby in the case where the color depth is 16 bits, for example, the brightness value becomes about 500, even if a $\frac{1}{100}$ brightness is used, hence the Kikuchi bands can be sufficiently detected. In the case of a specimen S which is thick and where the Kikuchi bands easily appear, the Kikuchi bands can be sufficiently detected even if the color depth is deceased to 8 bits or even if the exposure time is decreased.

Normally when a STEM image is captured, the dwell time of the electron probe at one measurement point is in the microsecond order. Here it is assumed that the exposure time is about several hundred milliseconds to 1000 milliseconds. If the exposure time is long like this, damage to the specimen S caused by radiation of the electron beam EB normally increases, and it is even possible that the specimen S is destroyed. In the present embodiment, focus is shirted as mentioned above, hence damage to the specimen S caused by radiation of the electron beam EB can be reduced, and the possibility of damage to the specimen S can be minimized.

Figure 3:
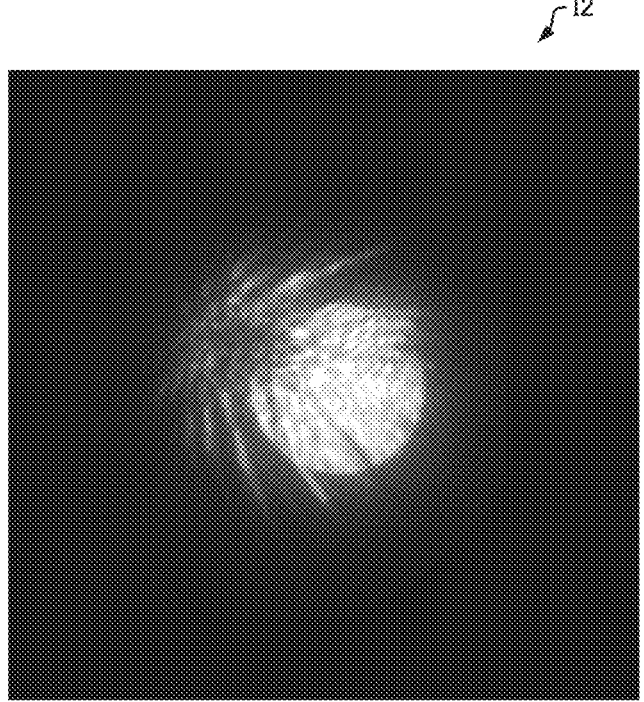
FIG. 3 illustrates a captured image.

FIG. 3 illustrates an image I2 including the Kikuchi bands appearing in the shadow region of the aperture 26.

As illustrated in FIG. 3, the image I2 includes a bright region inside the aperture 26, and a dark region of a shadow of the aperture 26. As mentioned above, by using an appropriate diameter of the aperture 26 and an appropriate camera length, the region inside the aperture 26 can be decreased, and the shadow region of the aperture 26 can be increased, whereby the influence of the diffraction spot can be reduced. Here the aperture 26, with which the incident angle becomes 50 mrad, is used, and the capturing angle is 200 mrad.

In the region inside the aperture 26, the real image (specimen image) and the Kikuchi bands overlap. In the shadow region of the aperture 26, on the other hand, the Kikuchi bands appear while the real image does not, and the Kikuchi bands and the real image do not overlap. The Kikuchi bands appear in the shadow region of the aperture 26 by increasing the exposure time.

(2) Detection of Center of Kikuchi Pattern

Next the center of the Kikuchi pattern is detected in the image I2. The center of the Kikuchi pattern is a position at which Kikuchi bands densely intersect.

Figure 4:
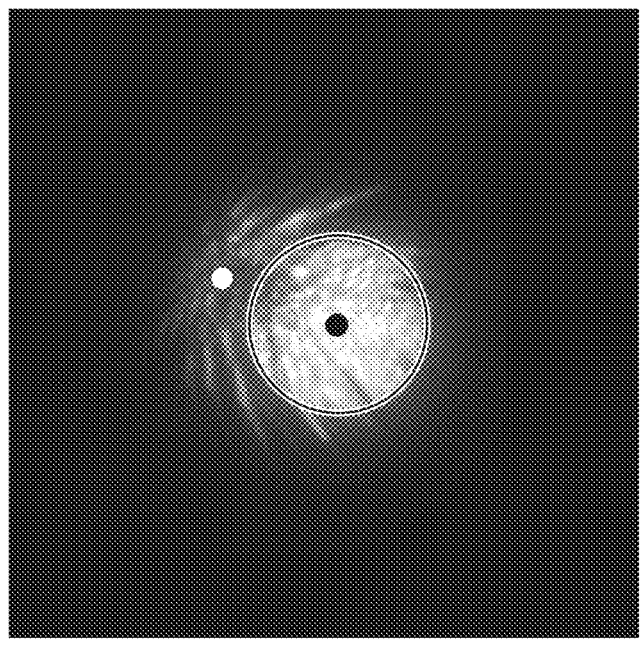
FIG. 4 is a diagram for explaining processing to detect a center of a Kikuchi pattern.
Figure 5:
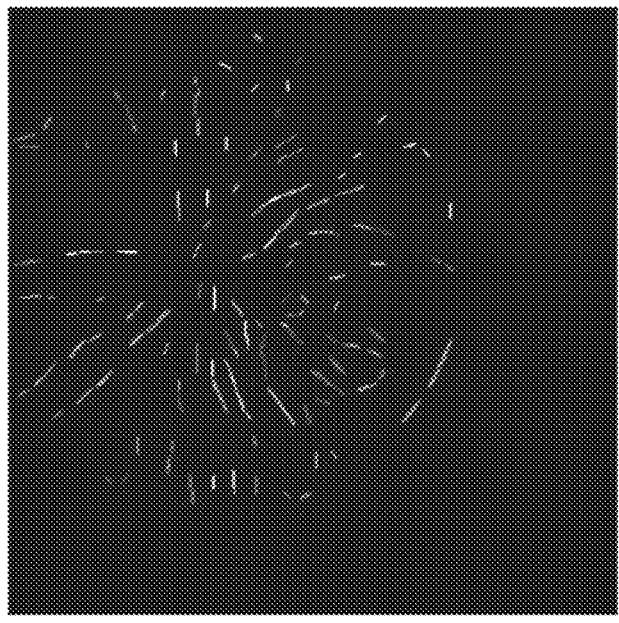
FIG. 5 is a diagram for explaining processing to detect a center of a Kikuchi pattern.
Figure 6:
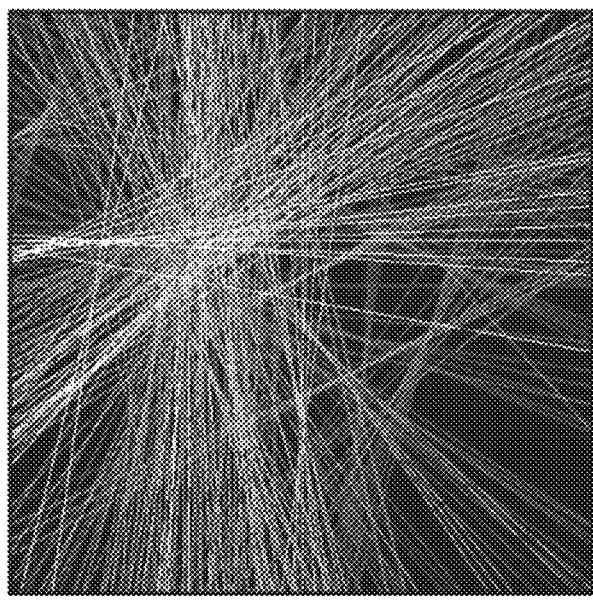
FIG. 6 is a diagram for explaining processing to detect a center of a Kikuchi pattern.

FIGS. 4 to 6 are diagrams for explaining processing to detect the center of the Kikuchi pattern.

First as illustrated in FIG. 4, a region inside the aperture 26 is identified. FIG. 4 illustrates a circle which is a contour of the hole of the aperture 26. Further, in FIG. 4, the center of the aperture 26 is indicated by a black dot, and the center of the Kikuchi pattern is indicated by a white dot.

Then the brightness difference between the region inside the aperture 26 and the shadow region of the aperture 26 is corrected. Specifically, the Kikuchi bands are enhanced by gamma correction, or the like.

Then the image is digitized, and the edge is detected in the digitized image as illustrated in FIG. 5, and the detected edges are extended as illustrated in FIG. 6. Thereby the detected edges can be crossed. Then the intersecting point of the edges is specified, and the position of the center of the distribution of the intersecting points of the edges is calculated. For example, the center of gravity of the intersecting point distribution is determined, and the center of gravity is regarded as the center position. Here in order to eliminate the influence of the lines detected in error, intersecting points distant from the center of gravity, which was determined using all the intersecting points, may be eliminated for calculation so that accuracy improves. Accuracy may also be improved by weighting the intersecting points in accordance with the strength and the length of the edge line. As a result, the position where the Kikuchi bands densely intersect, that is, the center of the Kikuchi pattern, can be detected.

Figure 7:
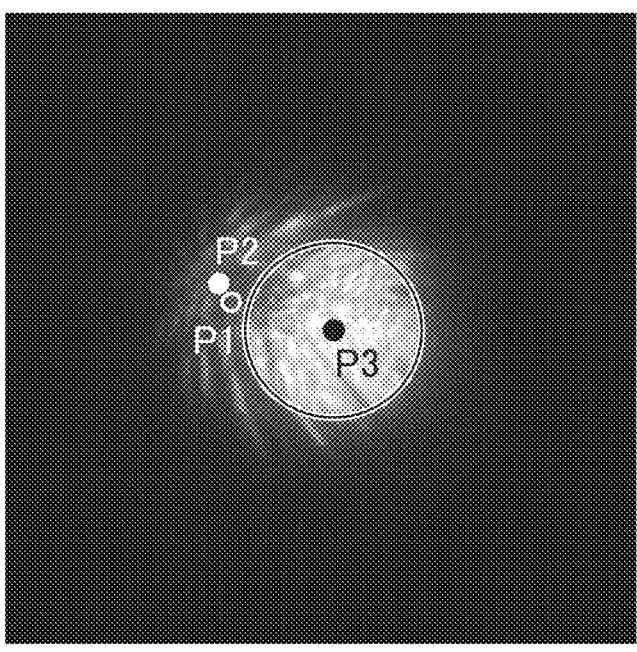
FIG. 7 is a diagram illustrating a result of detection of a center of a Kikuchi pattern.

FIG. 7 is an image illustrating a result of detecting the center of the Kikuchi pattern.

The position P2 at the center of the Kikuchi pattern illustrated in FIG. 7 is approximately at the same position as the position P1 at the real center of the Kikuchi pattern. In this way, the position of the center of the Kikuchi pattern can be accurately determined by the above mentioned method.

Then the deviation between the position P2 of the center of the Kikuchi pattern and the position P3 of the center of the aperture 26 is determined. This deviation between the position P2 and the position P3 corresponds to the deviation between the zone axis A of the specimen S and the incident direction (optical axis OA) of the electron beam EB. In other words, the deviation between the position P2 and the position P3 corresponds to the inclination of the specimen S with respect to the incident direction of the electron beam EB. In this way, the inclination of the specimen S can be determined from the detected position P2 of the center of the Kikuchi pattern.

In the above description, the center of the Kikuchi pattern, that is, the position at which Kikuchi bands densely intersect, is determined by detecting the edges of the Kikuchi bands, but the Kikuchi bands may be detected by extracting a region brighter than the surroundings by adaptive threshold processing, and the position at which the Kikuchi bands densely intersect may be determined thereby.

(3) Inclination of Specimen

The inclination of the specimen S with respect to the incident direction of the electron beam EB is controlled based on the Kikuchi pattern detected as described above. For example, the specimen S is inclined based on the determined deviation between the position P2 of the Kikuchi pattern and the position P3 of the center of the aperture 26, that is, the inclination of the specimen S. For example, the specimen S is inclined such that the position P2 matches with the position P3 in the image I2. As a result, the zone axis A of the specimen S can be matched with the incident direction of the electron beam EB. The specimen S is inclined using an inclining mechanism of the specimen stage 30.

Here the specimen S is inclined such that the position P2 of the center of the Kikuchi pattern matches with the position P3 of the center of the aperture 26, based on the assumption that the center of the aperture 26 is located on the optical axis OA. In a case where the optical axis OA is at the center of the image I2, for example, the position P2 may be matched with the position of the optical axis OA. Further, in a case where the optical axis OA matches with the center of the Ronchigram, the position P2 may be matched with the center of the Ronchigram.

In a case where the incident direction of the electron beam EB must be shifted from the zone axis A for observation, in order to prevent channeling, for example, the position P2 may be aligned at a position shifted from the position P3.

Here the zone axis A is matched with the incident direction of the electron beam EB by inclining the specimen S, but the incident direction of the electron beam EB may be matched with the zone axis A by inclining the electron beam EB using the deflector included in the irradiation optical system 20. Further, divergence and vibration, due to detection error, may be prevented by setting an upper limit for the inclination amount.

3. Operation

Figure 8:
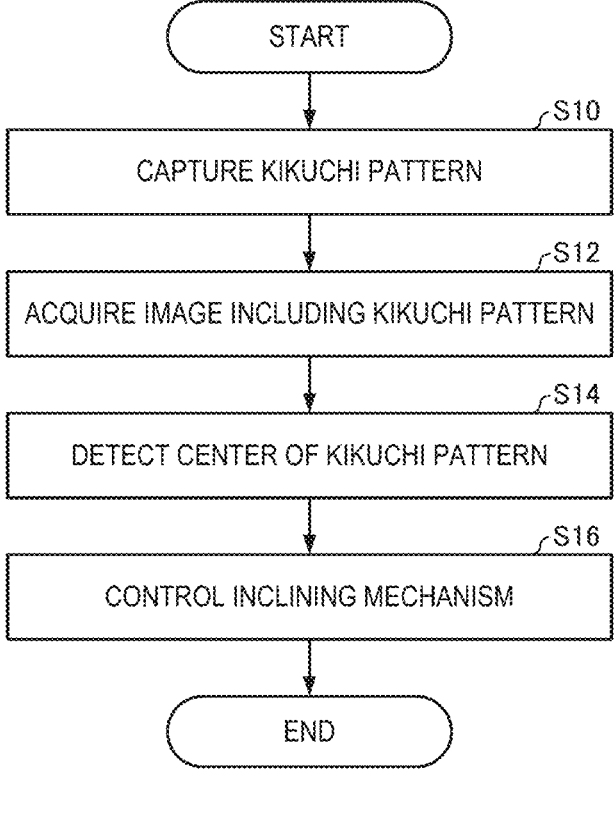
FIG. 8 is a flow chart illustrating an example of orientation alignment processing by a control unit.

The electron microscope 100 can automatically align the orientation of the specimen S as described above. FIG. 8 is a flow chart illustrating an example of the orientation alignment processing by the control unit 60.

First the control unit 60 causes the imaging apparatus 50 to capture the Kikuchi pattern (S10). The control unit 60 inserts the aperture 26 onto the optical axis OA, and shifts the focus by adjusting the excitation of the objective lens 42. The control unit 60 causes the electron beam to be irradiated to the specimen S, and causes the imaging apparatus 50 to capture the Kikuchi pattern of the specimen S. Here using the aperture 26 having a predetermined aperture diameter for capturing the Kikuchi pattern, the control unit 60 captures the image with the exposure time determined for capturing the Kikuchi pattern. As mentioned above, for the aperture 26 to capture the Kikuchi pattern, the aperture 26 having the optimum aperture diameter is used, so that the region inside the aperture 26 becomes small. The exposure time determined for capturing the Kikuchi pattern is set to be longer than the exposure time usually used for capturing a STEM image.

By the control unit 60 causing the imaging apparatus 50 to capture the Kikuchi pattern, the image I2, which includes the Kikuchi pattern appearing in the shadow of the aperture 26 illustrated in FIG. 3, is acquired. The image I2 includes the shadow region of the aperture 26, and in the shadow region of the aperture 26, a real image does not appear but the Kikuchi bands do.

Next the control unit 60 acquires the captured image I2 (S12), detects the center of the Kikuchi pattern in the shadow region of the aperture 26 in the image I2 (S14), and controls the inclining mechanism of the specimen stage 30 based on the detected center of the Kikuchi pattern (S16).

The control unit 60 detects the center of the Kikuchi pattern in the image I2, using the above mentioned method for detecting the center of the Kikuchi pattern, and determines the deviation between the position P2 of the center of the Kikuchi pattern and the position P3 of the center of the aperture 26, that is, the inclination of the specimen S, as illustrated in FIG. 7. Then the control unit 60 controls the inclining mechanism of the specimen stage 30 so that this deviation is compensated. As a result, the zone axis A of the specimen S can be matched with the incident direction of the electron beam EB. After controlling the inclining mechanism of the specimen stage 30, the control unit 60 ends the orientation alignment processing.

In a case where the electron microscope 100 includes a deflector to deflect the electron beam EB which enters the specimen S and changes the incident direction of the electron beam EB, the control unit 60 may control the deflector, so that the deviation between the position P2 of the center of the Kikuchi pattern and the position P3 of the center of the aperture 26 is compensated, and thereby match the incident direction of the electron beam EB with the zone axis A.

4. Effects

The electron microscope 100 includes the control unit 60 that controls the inclination of the specimen S with respect to the incident direction of the electron beam EB. The control unit 60 also acquires the image I2 that includes a Kikuchi pattern appearing in a shadow region of the aperture 26, detects the Kikuchi pattern in the shadow region of the aperture 26 in the image I2, and controls the inclination of the specimen S with respect to the incident direction of the electron beam EB based on the detected Kikuchi pattern.

Therefore in the electron microscope 100, Kikuchi bands can be easily detected, and orientation of the specimen S can be easily aligned.

For example, in some cases where a real image (specimen image) and Kikuchi bands overlap, the Kikuchi bands cannot be detected. Here the Kikuchi pattern appears in the shadow region of the aperture 26 in the image I2, but the real image does not. In the electron microscope 100, the Kikuchi pattern is detected in the shadow region of the aperture 26 in the image I2, hence the Kikuchi bands can be easily detected without the Kikuchi bands overlapping with the real image.

In the electron microscope 100, the control unit 60 causes the imaging apparatus 50 to capture the image I2 in the state where focus is shifted. Therefore in the electron microscope 100, damage to the specimen S caused by radiation of the electron beam EB can be reduced.

In the electron microscope 100, the control unit 60 controls the inclination of the specimen S, with respect to the incident direction of the electron beam EB, by controlling the inclining mechanism of the specimen stage 30. Therefore in the electron microscope 100, the orientation of the specimen S can be automatically aligned.

5. Modifications

The present invention is not limited to the above mentioned embodiments, but may be modified in various ways within the scope of the spirit of the present invention.

5.1. First Modification

In the embodiment described above, the inclination of the specimen S is calculated from one image I2, but the inclination of the specimen S may be calculated from an image set IS acquired under conditions where the incident directions of the electron beam EB are different.

Specifically, a plurality of images I2$i$ ($i$=1 to n) are captured while changing the incident direction of the electron beam EB to the specimen S, and an image set IS is acquired thereby. Each acquired image I2$i$ is an image acquired under a condition where the incident direction of the electron beam EB is different from other images. Then an inclination of the specimen S is determined in each image I2$i$. Here each image I2$i$ is an image acquired under a condition where the incident direction of the electron beam EB is different from the other images, hence the inclination of the specimen S is determined considering the difference of the incident direction. Then the average value of the inclination of the specimen S determined in each image I2$i$ is calculated. By controlling the inclining mechanism of the specimen stage 30 or the deflector, with this average value as the inclination of the specimen S, the incident direction of the electron beam EB is matched with the zone axis A.

For example, in some cases where the Kikuchi bands are dark in a specific image I2$i$ and cannot be clearly confirmed, detection of the edges and bands may fail, or a major error may be generated. If the image set IS is acquired and the orientation is aligned based on the average value of each inclination of the specimen S determined from the plurality of images I2$i$, as described above, the orientation of the specimen S can be aligned more accurately.

In the electron microscope 100 according to the first modification, the control unit 60 causes the imaging apparatus 50 to capture the image I2 so that the incident direction of the electron beam EB to the specimen S is different from the other images, and controls the inclination of the specimen S with respect to the incident direction of the electron beam EB, based on the image I2 captured under the condition where the incident direction is different from the other images. Therefore in the electron microscope 100 according to the first modification, the orientation of the specimen S can be accurately aligned.

5.2. Second Modification

In the embodiment described above, when the image I2 is acquired, the electron beam EB is irradiated to a predetermined region of the specimen S, and focus is shifted, so that damage to the specimen S due to radiation of the electron beam EB is reduced. However, the image I2 may also be captured by scanning the specimen S with the electron beam EB. Even if the position to which the electron beam EB is irradiated slightly changes, the Kikuchi pattern does not change as long as the crystal orientation of the specimen S is the same, therefore no problem occur. For example, if an irradiation time at one point is in the microsecond order, the damage to the specimen S due to the radiation of the electron beam EB can be reduced, even if the electron beam EB is focused on the specimen S.

In the electron microscope 100 according to the second modification, the control unit 60 scans the specimen S with the electron beam and causes the imaging apparatus 50 to capture the image I2. Therefore in the electron microscope 100 according to the second modification, damage to the specimen S due to radiation of the electron beam EB can be reduced.

5.3. Third Modification

Figure 9:
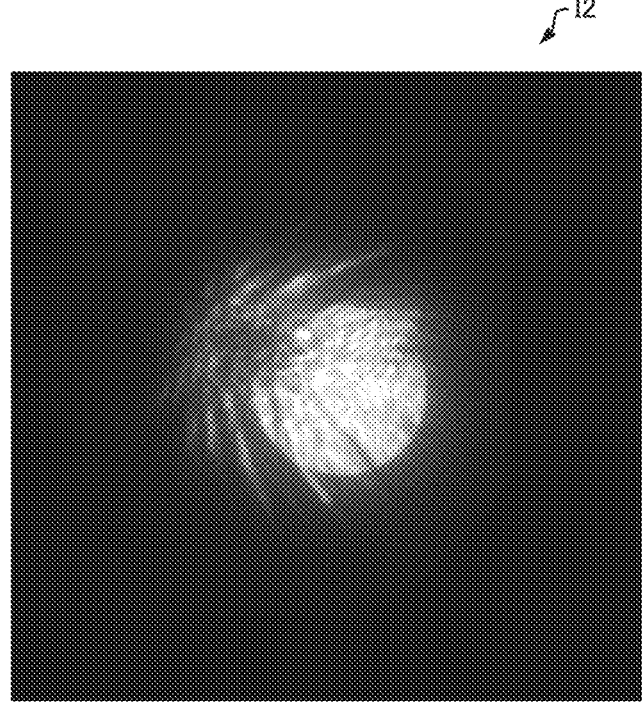
FIG. 9 is a diagram for explaining image processing according to the third modification.
Figure 9:
Figure 9:
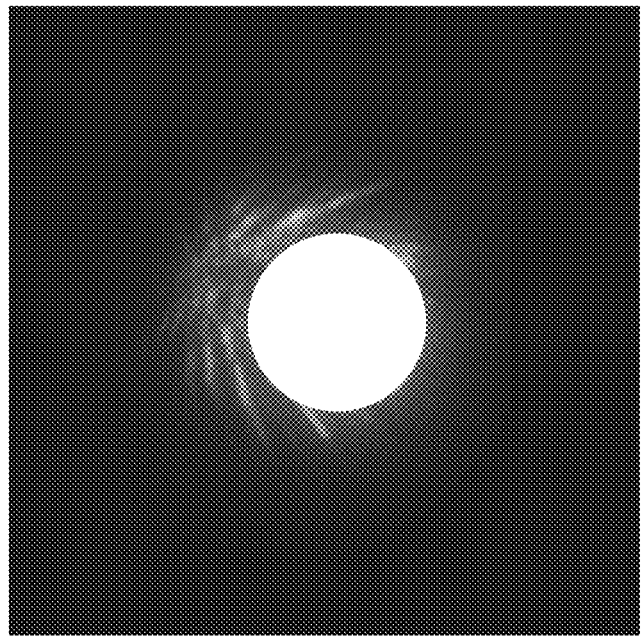

FIG. 9 is a diagram for explaining an image processing according to the third modification.

As illustrated in FIG. 9, in the processing to detect a Kikuchi pattern in the image I2, the control unit 60 performs processing to exclude a region inside the aperture 26, that is, a region where the real image (specimen image) appears, from the image I2, when the processing to detect the Kikuchi bands is performed. Thereby the Kikuchi bands can be accurately detected without detecting the real image (specimen image) as Kikuchi bands in error, and processing the detected real image. In the example in FIG. 9, the white circular region is the region that is excluded.

In some cases, a Ronchigram may be observed inside the aperture 26. In such a case as well, if the region inside the aperture 26 is excluded from the image I2 in the same manner, the Kikuchi bands can be accurately detected without detecting the Ronchigram as Kikuchi bands in error, and processing the detected Ronchigram.

5.4. Fourth Modification

In the embodiment described above, the control unit 60 performs the processing in FIG. 8, and aligns the orientation of the specimen S, but in a case where the inclination of the specimen S is large, for example, orientation may not be accurately aligned by one processing. Therefore the control unit 60 may repeat the processing in FIG. 8, so as to align the orientation accurately.

Figure 10:
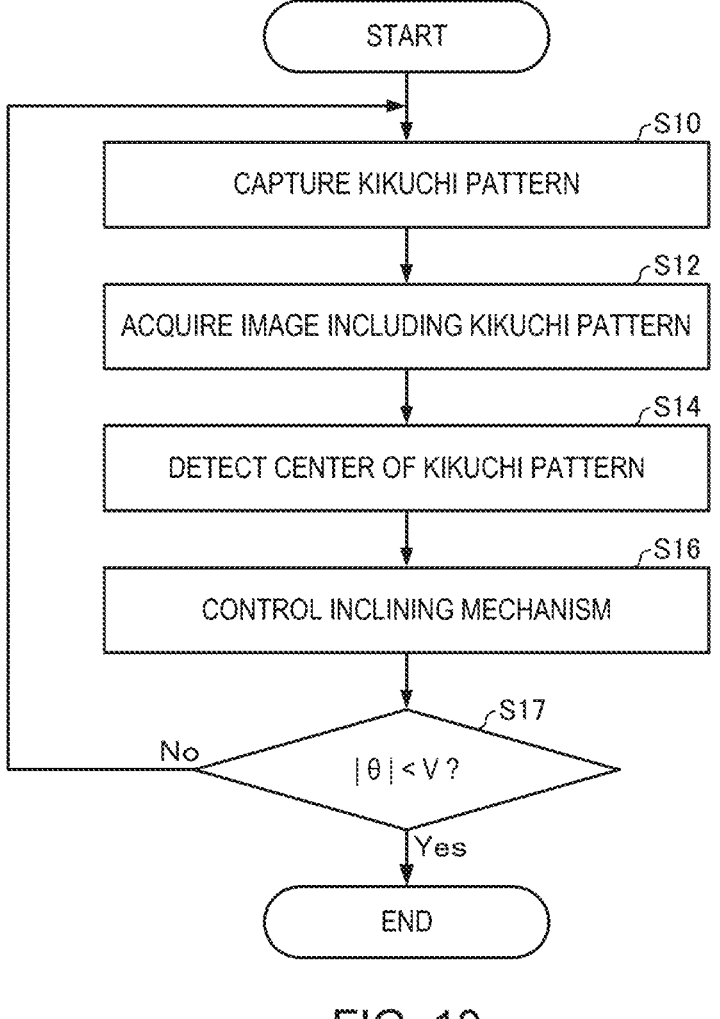
FIG. 10 is a flow chart illustrating a modification of the orientation alignment processing by the control unit.

FIG. 10 is a flow chart illustrating a modification of the orientation alignment processing by the control unit 60. In the following, aspects different from the orientation alignment processing in FIG. 8 will be described, and description on the same aspects will be omitted.

After controlling the inclining mechanism of the specimen stage 30 (after processing step S16), the control unit 60 determines whether the angle θ of the zone axis A, with respect to the incident direction of the electron beam EB, is smaller than the tolerance V, that is, the control unit 60 determines whether $|\theta| < V$ is satisfied (S17). If it is determined that $|\theta| < V$ is not satisfied (No in S17), the control unit 60 returns to the processing step S10, and executes the processing steps S10, S12, S14, S16 and S17.

The control unit 60 repeats the processing steps S10, S12, S14, S16 and S17 until |θ|<V is satisfied. The control unit 60 ends the processing if it is determined that |θ|<V is satisfied (Yes in S17). Since the processing steps S10, S12, S14, S16 and S17 are repeated until the angle θ becomes smaller than the tolerance V, the control unit 60 can align the orientation accurately.

5.5. Fifth Modification

In the fifth modification, orientation can be accurately aligned by repeating the processing steps illustrated in FIG. 8, just like the fourth modification described above.

Figure 11:
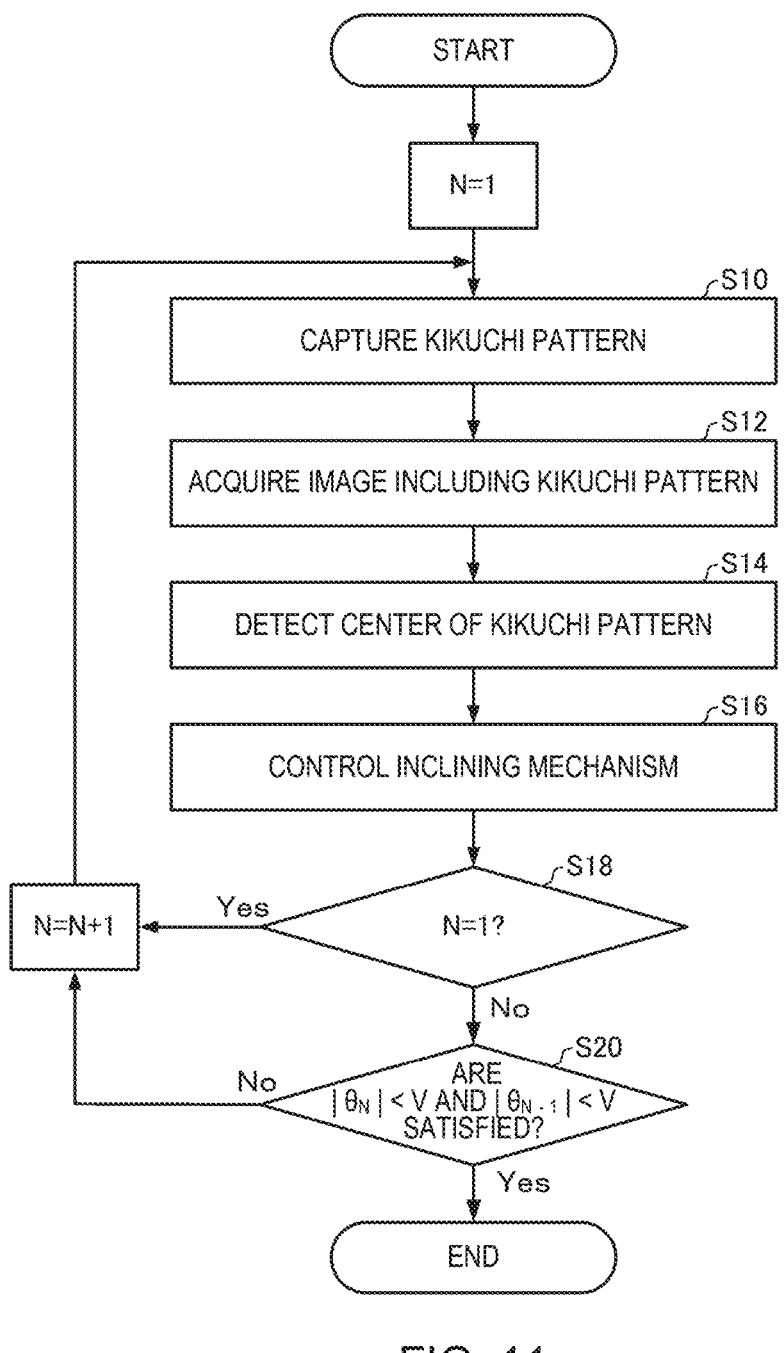
FIG. 11 is a flow chart illustrating a modification of the orientation alignment processing by the control unit.

FIG. 11 is a flow chart illustrating a modification of the orientation alignment processing by control unit 60. In the following, aspects different from the orientation alignment processing in FIGS. 8 and 10 will be described, and description on the same aspects will be omitted.

After controlling the inclining mechanism of the specimen stage 30 (after processing step S16), the control unit 60 determines whether or not the repeat count N of the orientation alignment processing is 1 (S18). If it is determined that N=1 (Yes in S18), the control unit 60 returns to the processing step S10, and executes the processing steps S10, S12, S14, S16 and S18.

In the case of N>1, the control unit 60 ends the orientation alignment processing if it is determined that both the angle $θ_N$ of the zone axis A with respect to the incident direction of the electron beam EB determined in the Nth processing, and the angle $θ_{N-1}$ of the zone axis A with respect to the incident direction of the electron beam EB determined in the (N–1)th processing, are smaller than the tolerance V, that is, if it is determined that | $θ_N$ |<V and | $θ_{N-1}$ |<V are satisfied, and the value of the angle θ is converged (Yes in S20). If |θ|<V and | $θ_{N-1}$ |<V are not satisfied (No in S20), on the other hand, the control unit 60 returns to the processing step S10, and executes the processing steps S10, S12, S14, S16 and S18. In this way, the control unit 60 repeats the processing steps until the value of the angle θ is converged. As a result, the orientation can be aligned accurately.

The embodiments and modifications described above are examples, and the present invention is not limited thereto. For example, each embodiment and modification may be combined if necessary.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

What is claimed is:

1. An electron microscope comprising:
an irradiation optical system that irradiates a specimen with an electron beam;
a specimen stage that supports the specimen;
an image forming optical system that forms an image of electrons transmitted through the specimen;

an imaging apparatus that captures an image formed by the image forming optical system; and
a control unit that controls inclination of the specimen with respect to an incident direction of the electron beam,
wherein the irradiation optical system comprises an aperture that cuts off a part of the electron beam to be irradiated to the specimen, and
wherein the control unit is configured to:
acquire an image including Kikuchi bands that appear in a shadow region of the aperture,
detect the Kikuchi bands in the shadow region of the aperture in the image, and
control inclination of the specimen with respect to the incident direction of the electron beam, based on the detected Kikuchi bands.

2. The electron microscope according to claim 1, wherein the control unit causes the imaging apparatus to capture the image.

3. The electron microscope according to claim 2, wherein the control unit causes the imaging apparatus to capture the image in a defocused state.

4. The electron microscope according to claim 2, wherein the control unit causes the imaging apparatus to capture the image by scanning the specimen with the electron beam.

5. The electron microscope according to claim 2, wherein the control unit causes the imaging apparatus to capture a plurality of images under a plurality of mutually different conditions of the incident direction of the electron beam with respect to the specimen, and
the control unit controls the inclination of the specimen with respect to the incident direction of the electron beam, based on the plurality of images and the plurality of conditions.

6. The electron microscope according to claim 1, wherein the specimen stage comprises an inclining mechanism to incline the specimen, and
the control unit controls the inclination of the specimen with respect to the incident direction of the electron beam, by controlling the inclining mechanism.

7. The electron microscope according to claim 1, wherein the control unit controls the inclination of the specimen with respect to the incident direction of the electron beam such that a center of a Kikuchi pattern and a center of the optical axis match in the image.

8. A specimen orientation alignment method for an electron microscope comprising an irradiation optical system that irradiates a specimen with an electron beam, a specimen stage that supports the specimen, an image forming optical system that forms an image of electrons transmitted through the specimen, and an imaging apparatus that captures an image formed by the image forming optical system, the irradiation optical system comprising an aperture that cuts off a part of the electron beam to be irradiated to the specimen,
the method comprising:
acquiring an image comprising Kikuchi bands that appear in a shadow region of the aperture;
detecting the Kikuchi bands in the shadow region of the aperture in the image; and
controlling inclination of the specimen with respect to the incident direction of the electron beam, based on the detected Kikuchi bands.

* * * * *